(12) United States Patent
Chen et al.

(10) Patent No.: US 10,103,110 B2
(45) Date of Patent: *Oct. 16, 2018

(54) SEMICONDUCTOR PACKAGE STRUCTURE AND FABRICATION METHOD THEREOF

(71) Applicant: Advanced Semiconductor Engineering, Inc., Kaohsiung (TW)

(72) Inventors: Tien-Szu Chen, Kaohsiung (TW); Sheng-Ming Wang, Kaohsiung (TW); Kuang-Hsiung Chen, Kaohsiung (TW); Yu-Ying Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/873,784

(22) Filed: Jan. 17, 2018

(65) Prior Publication Data

US 2018/0145037 A1 May 24, 2018

Related U.S. Application Data

(63) Continuation of application No. 14/268,981, filed on May 2, 2014, now Pat. No. 9,911,702.

(30) Foreign Application Priority Data

May 3, 2013 (CN) .......................... 2013 1 0161037

(51) Int. Cl.
*H01L 21/00* (2006.01)
*H01L 23/00* (2006.01)
(Continued)

(52) U.S. Cl.
CPC ........ *H01L 23/562* (2013.01); *H01L 23/3135* (2013.01); *H01L 24/97* (2013.01);
(Continued)

(58) Field of Classification Search
CPC ........... H01L 2924/181; H01L 2924/14; H01L 2924/10253; H01L 23/3107; H01L 2924/16152
(Continued)

(56) References Cited

U.S. PATENT DOCUMENTS 5,369,058 A * 11/1994 Burns ..................... H01L 23/16
156/153
5,895,232 A * 4/1999 Burns ..................... H01L 23/16
257/E23.124
(Continued)

FOREIGN PATENT DOCUMENTS

| CN | 1215501 A | 4/1999 |
| CN | 102254836 A | 11/2011 |
| CN | 102576682 A | 7/2012 |

OTHER PUBLICATIONS

Office Action on Chinese Patent Application No. 201310161037.8 dated Mar. 16, 2015, 6 pages.
(Continued)

Primary Examiner — S. V. Clark
(74) Attorney, Agent, or Firm — Foley & Lardner LLP; Cliff Z. Liu

(57) ABSTRACT

A semiconductor package structure and a fabrication method thereof are provided. The fabrication method comprises: providing a substrate strip, the substrate strip comprising a plurality of substrate units which comprise a substrate unit; disposing a plurality of chips on the plurality of substrate units; disposing a packaging encapsulant on the substrate strip to encapsulate the chips; forming a warp-resistant layer on a top surface of the packaging encapsulant; and dividing the substrate strip to separate the plurality of substrate units to further fabricate a plurality of semiconductor package structures which comprise a semiconductor package structure comprising the substrate unit, wherein the warp-resis-
(Continued)

tant layer is formed of a selected material with a selected thickness to make a variation of warpage of the semiconductor package structure at a temperature between 25° C. and 260° C. to be smaller than 560 μm.

25 Claims, 3 Drawing Sheets

(51) Int. Cl.
*H01L 23/31* (2006.01)
*H01L 23/498* (2006.01)
*H01L 21/56* (2006.01)

(52) U.S. Cl.
CPC ...... *H01L 21/561* (2013.01); *H01L 23/49816* (2013.01); *H01L 23/49827* (2013.01); *H01L 24/16* (2013.01); *H01L 24/32* (2013.01); *H01L 24/48* (2013.01); *H01L 24/73* (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2224/81* (2013.01); *H01L 2224/97* (2013.01); *H01L 2924/15311* (2013.01); *H01L 2924/181* (2013.01); *H01L 2924/3511* (2013.01); *H01L 2924/37001* (2013.01)

(58) Field of Classification Search
USPC ........ 438/125, 126, 127, 110, 113; 257/701, 257/704, 787
See application file for complete search history.

(56) References Cited

U.S. PATENT DOCUMENTS

| | | | | |
|---|---|---|---|---|
| 6,411,507 B1* | 6/2002 | Akram | ............... | H01L 23/3675 |
| | | | | 165/185 |
| 6,538,317 B1 | 3/2003 | Miyata | | |
| 6,709,895 B1* | 3/2004 | Distefano | ............... | H01L 23/16 |
| | | | | 257/E23.092 |
| 6,784,541 B2* | 8/2004 | Eguchi | ................... | H01L 21/56 |
| | | | | 257/675 |
| 9,911,702 B2* | 3/2018 | Chen | ..................... | H01L 23/562 |
| 2012/0171814 A1* | 7/2012 | Choi | ..................... | H01L 21/561 |
| | | | | 438/107 |
| 2013/0026662 A1* | 1/2013 | Iwashige | ................. | C08L 61/06 |
| | | | | 257/788 |
| 2013/0320525 A1* | 12/2013 | Lin | ................... | H01L 23/49811 |
| | | | | 257/737 |
| 2015/0029673 A1* | 1/2015 | Kadoike | ............ | H05K 7/20454 |
| | | | | 361/720 |

OTHER PUBLICATIONS

Non-Final Office Action for U.S. Appl. No. 14/268,981, dated Jul. 2, 2015.
Final Office Action for U.S. Appl. No. 14/268,981, dated Oct. 23, 2015.
Non-Final Office Action for U.S. Appl. No. 14/268,981, dated May 20, 2016.
Non-Final Office Action for U.S. Appl. No. 14/268,981, dated May 2, 2017.
Final Office Action for U.S. Appl. No. 14/268,981, dated Aug. 10, 2017.
Notice of Allowance for U.S. Appl. No. 14/268,981, dated Oct. 27, 2017.

* cited by examiner

SEMICONDUCTOR PACKAGE STRUCTURE AND FABRICATION METHOD THEREOF

CROSS REFERENCE TO RELATED APPLICATIONS

This application is a continuation of U.S. patent application Ser. No. 14/268,981, filed on May 2, 2014, which claims the benefit of Chinese Patent Application No. 201310161037.8, filed on May 3, 2013, the contents of which are incorporated herein by reference in their entirety.

FIELD OF THE INVENTION

The present disclosure relates to a semiconductor package structure, and more particularly to a semiconductor package structure that does not warp easily and a fabrication method thereof.

BACKGROUND OF THE INVENTION

Currently, various types of package structures have been developed in the semiconductor packaging industry to meet various demands. In a common packaging process, chips are distributed on a substrate, and a packaging encapsulant is then used to encapsulate the chips to complete a package body; meanwhile, solder balls are disposed at the back surface of the substrate for subsequently soldering the package body on a circuit board.

Generally speaking, in a common packaging process, a substrate strip is used to provide a plurality of areas for disposing chips. After all the chips have been distributed on the substrate strip, a packaging encapsulant is disposed on the surface of the substrate strip to encapsulate the chips, and the substrate strip is then divided into a plurality of separate semiconductor package structures.

During a fabrication process, a semiconductor package structure often stays in a high-temperature environment. However, due to the mismatch in coefficient of thermal expansion (CTE) between a substrate and a packaging encapsulant, the substrate and the packaging encapsulant are subject to different degrees of thermal expansion resulting in stress effects, causing a warpage phenomenon; also, because at present electronic products tend to become smaller in size, the overall thickness of the semiconductor package structure decreases accordingly, making the warpage phenomenon in the semiconductor package structure more easily observable.

The variation of warpage of a semiconductor package structure between the room temperature (usually about 25° C.) and the maximum temperature (usually about 260° C.) in a fabrication process usually causes many defects and problems in the products, such as possible poor internal wire bonding in a wire-bonded semiconductor package structure, possible crack of a bump-bonding or a pillar-bonding below a chip of the semiconductor package structure that uses the flip chip technology, or unsatisfactorily attaching solder balls, which are present at the bottom of a semiconductor package structure, onto a circuit board when the semiconductor package structure is disposed on the circuit board.

Therefore, it is necessary to provide a semiconductor package structure and a fabrication method thereof to solve problems that exist in the prior art.

SUMMARY OF THE DISCLOSURE

In view of this, the present disclosure provides a fabrication method of a semiconductor package structure so as to mitigate a warpage problem in the existing semiconductor package structure.

The primary objective of the present disclosure is to provide a fabrication method of a semiconductor package structure, in which a warp-resistant layer formed on a packaging encapsulant is used to increase the structural strength of the overall semiconductor package structure, thereby effectively lowering the variation of warpage of the semiconductor package structure during the semiconductor package structure is heated.

The secondary objective of the present disclosure is to provide a semiconductor package structure which has a warp-resistant layer to strengthen the warp-resisting capability of the overall structure.

To achieve the foregoing objectives of the present disclosure, an embodiment of the present disclosure provides a fabrication method of a semiconductor package structure, the fabrication method comprising: providing a substrate strip, the substrate strip comprising a plurality of substrate units; disposing a plurality of chips on the plurality of substrate units; disposing a packaging encapsulant on the substrate strip to encapsulate the chips; forming a warp-resistant layer on a top surface of the packaging encapsulant; and dividing the substrate strip to separate the plurality of substrate units to further fabricate a plurality of semiconductor package structures, wherein the warp-resistant layer is formed of a selected material with a selected thickness to make a variation of warpage of the semiconductor package structure at a temperature between 25° C. and 260° C. to be smaller than 560 µm.

Another embodiment of the present disclosure provides a fabrication method of a semiconductor package structure, the fabrication method comprising: providing a substrate strip, the substrate strip comprising a plurality of substrate units, the area of each substrate unit being between 302.76 $mm^2$ and 309.76 $mm^2$; disposing a plurality of chips on the plurality of substrate units; disposing a packaging encapsulant on the substrate strip to encapsulate the chips; forming a warp-resistant layer on a top surface of the packaging encapsulant; and dividing the substrate strip to separate the plurality of substrate units to further fabricate a plurality of semiconductor package structures, wherein the warp-resistant layer is formed of a selected material with a selected thickness to make a variation of warpage of the semiconductor package structure at a temperature between 25° C. and 260° C. to be between 75 µm and 235 µm.

Another embodiment of the present disclosure provides a fabrication method of a semiconductor package structure, the fabrication method comprising: providing a substrate strip, the substrate strip comprising a plurality of substrate units, the area of each substrate unit being between 357.21 $mm^2$ and 364.81 $mm^2$; disposing a plurality of chips on the plurality of substrate units; disposing a packaging encapsulant on the substrate strip to encapsulate the chips; forming a warp-resistant layer on a top surface of the packaging encapsulant; and dividing the substrate strip to separate the plurality of substrate units to further fabricate a plurality of semiconductor package structures, wherein the warp-resistant layer is formed of a selected material with a selected thickness to make a variation of warpage of the semiconductor package structure at a temperature between 25° C. and 260° C. to be between 113 µm and 238 µm.

Another embodiment of the present disclosure provides a fabrication method of a semiconductor package structure, the fabrication method comprising: providing a substrate strip, the substrate strip comprising a plurality of substrate units, the area of each substrate unit being between 404.01 $mm^2$ and 412.09 $mm^2$; disposing a plurality of chips on the plurality of substrate units; disposing a packaging encapsulant on the substrate strip to encapsulate the chips; forming a warp-resistant layer on a top surface of the packaging encapsulant; and dividing the substrate strip to separate the plurality of substrate units to further fabricate a plurality of semiconductor package structures, wherein the warp-resistant layer is formed of a selected material with a selected thickness to make a variation of warpage of the semiconductor package structure at a temperature between 25° C. and 260° C. to be between 151 μm and 290 μm.

Another embodiment of the present disclosure provides a semiconductor package structure comprising: a substrate unit; a chip disposed on the substrate unit; a packaging encapsulant disposed on the substrate unit and encapsulating the chip; and a warp-resistant layer formed on a top surface of the packaging encapsulant, wherein the warp-resistant layer is formed of a selected material with a selected thickness to make a variation of warpage of the semiconductor package structure at a temperature between 25° C. and 260° C. to be smaller than 560 μm.

In contrast with the prior art, the method of fabricating a semiconductor package structure provided by the present disclosure further uses a selected material to form a warp-resistant layer of a selected thickness on a top surface of a packaging encapsulant, so that the semiconductor package structure has less warpage in a high-temperature environment, mitigating the yield problem caused by a variation of warpage.

BRIEF DESCRIPTION OF THE DRAWINGS

The present disclosure will be described according to the appended drawings in which.

DETAILED DESCRIPTION

In order to make the foregoing objectives, features, and advantages of the present disclosure clearer and easier to understand, the preferred embodiments of the present disclosure are illustrated in detail below with reference to the accompanying drawings. Moreover, spatial terms mentioned in the present disclosure, such as "on", "under", "top", "bottom", "front", "rear", "left", "right", "in", "out", "side", "around", "center", "horizontal", "lateral", "vertical", "longitudinal", "axial", "radial", "the top layer" or "the bottom layer," are only directed to spatial relationships with reference to the accompanying drawings. Therefore, the spatial terms are used for illustrating and understanding the present disclosure, not limiting the present disclosure.

Figure 1:
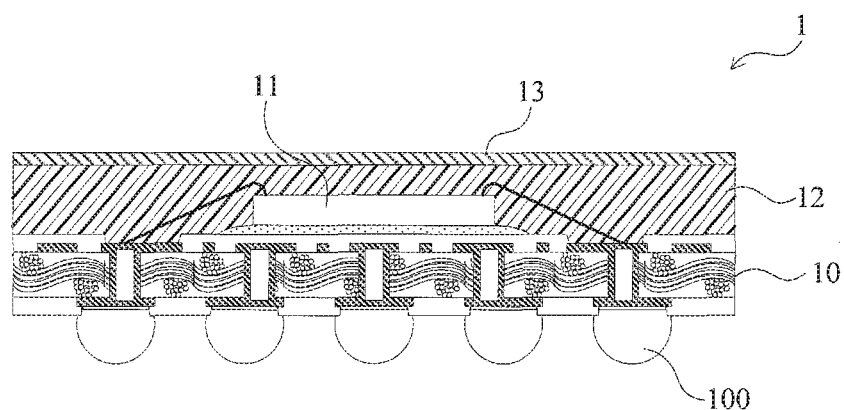
FIG. 1 is a schematic cross-sectional view of a semiconductor package structure according to an embodiment of the present disclosure.

Referring to FIG. 1, a semiconductor package structure 1 according to an embodiment of the present disclosure mainly comprises a substrate unit 10, a chip 11, a packaging encapsulant 12, and a warp-resistant layer 13.

Figure 2:
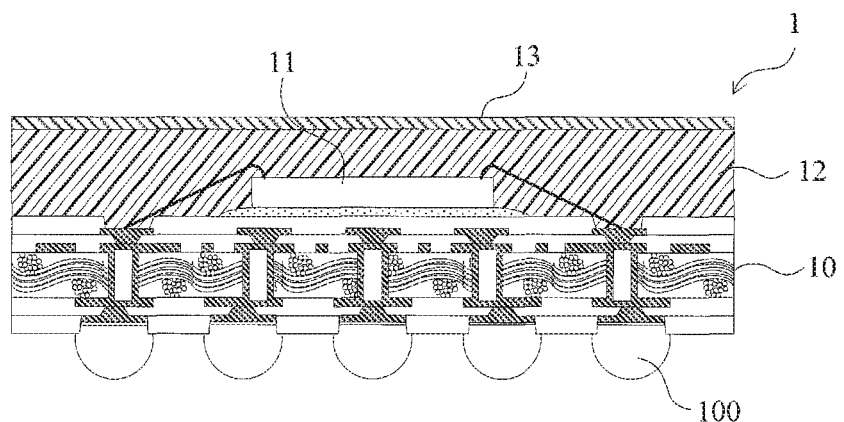
FIG. 2 is a schematic cross-sectional view of a semiconductor package structure according to another embodiment of the present disclosure.
Figure 3:
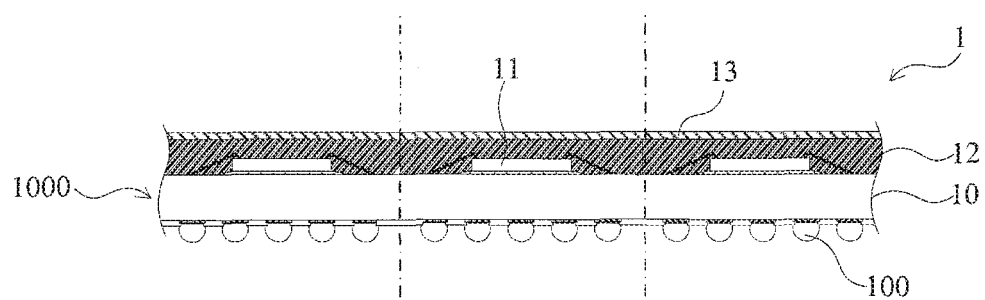
FIG. 3 is a schematic cross-sectional view of a semiconductor package structure before being cut according to an embodiment of the present disclosure.

The substrate unit 10 may be a small multi-layer printed circuit board. An insulating layer made of glass fiber and epoxy resin is formed, and then the insulating layer and circuit layers are alternately stacked to form the small multi-layer printed circuit board. For example, the substrate unit 10 may comprise two circuit layers, as shown in FIG. 1, or four circuit layers, as shown in FIG. 2. However, the number of circuit layers is not limited as the figures show. Referring to FIG. 3, in a semiconductor packaging process, a plurality of identical substrate units may be distributed on a substrate strip 1000, which is then cut into separate single substrate units 10 after the chips are packaged. The substrate unit 10 has an upper surface and a lower surface. A plurality of solder balls 100 are provided on the lower surface of the substrate unit 10.

The chips 11 are disposed on the upper surface of the substrate unit 10. The chip 11 has an active surface, and the active surface may be electrically connected to the substrate unit 10 through, for example, wires or conductive bumps. In FIG. 1, the active surface of each chip 11 is electrically connected to the substrate unit 10 through wires.

The packaging encapsulant 12 is disposed on the substrate unit 10, encapsulates the chips 11 and may be epoxy resin or similar resin material.

The warp-resistant layer 13 is formed on a top surface of the packaging encapsulant 12. The warp-resistant layer 13 is formed of a selected material with a selected thickness. The selected material may be metal, such as chromium; or silicon dioxide, graphite or organic compounds. The warp-resistant layer 13 may be formed on the top surface of the packaging encapsulant via physical vapor deposition (PVD), such as sputtering. It should be noted that the warp-resistant layer 13 may be formed on the packaging encapsulant on the substrate strip first before substrate strip is cut, so that after the substrate strip is cut into the substrate units, the warp-resistant layer 13 is only disposed on the top surface of the packaging encapsulant 12, making the warp-resistant layer 13 and the substrate unit 10 insulated from each other and disconnected from any conductor or grounding terminal. Moreover, the selected thickness of the warp-resistant layer 13 may be between 0.5 μm and 3 μm. The warp-resistant layer 13 formed of a selected material with a selected thickness may make a variation of warpage of the semiconductor package structure 1 at a temperature between 25° C. and 260° C. to be approximately smaller than 290 μm, and to be approximately smaller than 210 μm under ideal conditions.

As can be seen from the foregoing description, an embodiment of the present disclosure provides a method for fabricating the semiconductor package structure 1. The method may comprise the steps of: a substrate strip 1000 may be provided first, the substrate strip 1000 including a plurality of substrate units 10; next, a plurality of chips 11 are disposed on the plurality of substrate units 10; next, a packaging encapsulant 12 is disposed on the substrate strip 1000 to encapsulate the chips 11; subsequently, a warp-resistant layer 13 is formed on a top surface of the packaging encapsulant 12; in the end, the substrate strip 1000 is cut to separate the plurality of substrate units 10 to further fabricate a plurality of the aforementioned semiconductor package structures 1.

Figure 4:
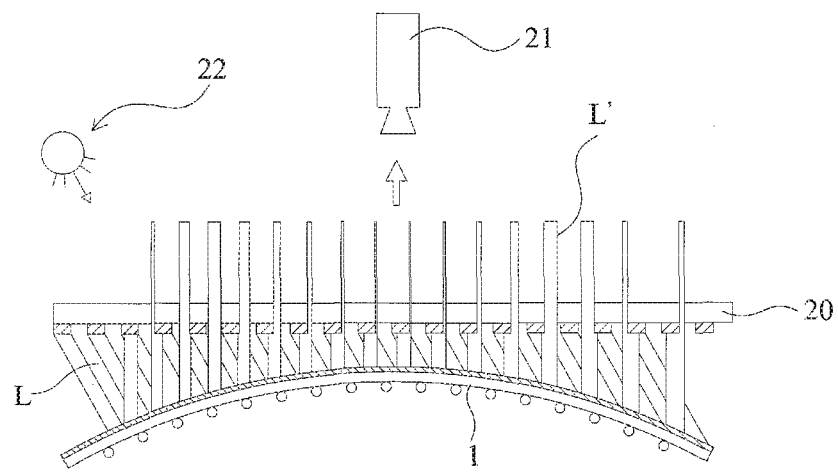
FIG. 4 is a schematic view of a warpage measurement apparatus according to an embodiment of the present disclosure.

The aforementioned variation of warpage refers to a difference between a maximum warpage value and a minimum warpage value of the semiconductor package structure at a temperature between 25° C. and 260° C. For example, the semiconductor package structure shows a maximum warpage value S1 at a specific temperature and a minimum warpage value S2 at another specific temperature. The absolute value of the difference between the maximum warpage value S1 and the minimum warpage value S2, |(S1−S2)|, is the variation of warpage. The warpage may be measured by a warpage measurement apparatus, as shown in FIG. 4. The warpage measurement apparatus mainly comprises a grating 20, an optical sensing apparatus 21, and an incident light source 22. During measurement of warpage, the semiconductor package structure 1 may be placed below the grating 20; then, the incident light source 22 projects an incident light ray L to the grating 20, so that the incident light ray L passes through the grating 20 and reaches the top surface of the semiconductor package structure 1; then, the incident light ray L is reflected by the top surface of the semiconductor package structure 1 back to the grating 20. When the reflected light ray L' passes through the grating 20, the optical sensing apparatus 21 senses the reflected light ray L', and a computing system linked to the optical sensing apparatus 21 may calculate the warpage of the semiconductor package structure 1 according to the change of the reflected light ray L'. The warpage measurement apparatus may be TherMoiré PS400 from Akrometrix Inc., so as to calculate the warpage of the semiconductor package structure at different temperatures.

Tables 1-1 to 1-3 below are statistical tables of the variation of warpage of the semiconductor package structure according to an embodiment of the present disclosure with different thicknesses of warp-resistant layers when the area of the substrate unit 10 is between 98 mm² and 150 mm². TherMoiré PS400 from Akrometrix Inc. is used to measure warpage. As shown in Table 1-1, when the size of the substrate unit 10 of the semiconductor package structure 1 is approximately 100 mm² (for example, for a square substrate of 10 mm*10 mm under a fabrication tolerance of ±0.1 mm, the range of the area is approximately between 98.01 mm² and 102.01 mm²), at a temperature between 25° C. and 260° C., the variation of warpage of the semiconductor package structure having a warp-resistant layer 13 that is made of the material chromium and has a thickness between 0.5 μm and 3 μm may be lowered to between 53 μm (for example, when a selected 3-μm warp-resistant layer is used in the semiconductor package structure having the substrate and encapsulant parameters shown in Table 1-1) and 60 μm (for example, when a selected 2 or 2.5-μm warp-resistant layer is used in a semiconductor package structure having the substrate and encapsulant parameters shown in Table 1-1), in contrast with a semiconductor package structure without a warp-resistant layer.

TABLE 1-1

| | Variation of warpage | | | | | | |
|---|---|---|---|---|---|---|---|
| | 66 | 59 | 59 | 54 | 60 | 60 | 53 |
| Thickness of warp-resistant layer | 0 μm | 0.5 μm | 1 μm | 1.5 μm | 2 μm | 2.5 μm | 3 μm |
| Material | | | | Cr | | | |
| Thickness of substrate (mm) | | | | 0.26 | | | |
| Number of substrate layers | | | | 2 | | | |
| Thickness of encapsulant (mm) | | | | 1 | | | |
| Size (mm²) | | | | 10 × 10 | | | |

TABLE 1-2

| | Variation of warpage | | | | | | |
|---|---|---|---|---|---|---|---|
| | 77 | 64 | 92 | 94 | 104 | 85 | 99 |
| Thickness of warp-resistant layer | 0 μm | 0.5 μm | 1 μm | 1.5 μm | 2 μm | 2.5 μm | 3 μm |
| Material | | | | Cr | | | |
| Thickness of substrate (mm) | | | | 0.26 | | | |
| Number of substrate layers | | | | 4 | | | |
| Thickness of encapsulant (mm) | | | | 0.54 | | | |
| Size (mm²) | | | | 12 × 12 | | | |

TABLE 1-3

| | Variation of warpage | | | | | | |
|---|---|---|---|---|---|---|---|
| | 110 | 99 | 68 | 82 | 89 | 98 | 85 |
| Thickness of warp-resistant layer | 0 μm | 0.5 μm | 1 μm | 1.5 μm | 2 μm | 2.5 μm | 3 μm |
| Material | | | | Cr | | | |
| Thickness of substrate (mm) | | | | 0.26 | | | |
| Number of substrate layers | | | | 2 | | | |
| Thickness of encapsulant (mm) | | | | 0.7 | | | |
| Size (mm²) | | | | 12 × 12 | | | |

Referring to Table 1-2 and Table 1-3, when the size of the substrate unit 10 of the semiconductor package structure 1 is approximately 144 mm² (for example, for a square substrate of 12 mm*12 mm under a fabrication tolerance of ±0.1 mm, the range of the area is approximately between 141.61 mm² and 146.41 mm²), at a temperature between 25° C. and 260° C., the variation of warpage of the semiconductor package structure having a warp-resistant layer 13 that is made of the material chromium and has a thickness between 0.5 μm and 3 μm may be lowered to between 64 μm (for example, when a selected 0.5-μm warp-resistant layer is used in a semiconductor package structure having the substrate and encapsulant parameters shown in Table 1-2) and 99 μm (for example, when a selected 0.5-μm warp-resistant layer is used in a semiconductor package structure having the substrate and encapsulant parameters shown in Table 1-3), in contrast with a semiconductor package structure without a warp-resistant layer.

Further, as shown in the results in Table 1-1 to Table 1-3, when the area of the substrate is between 98 mm² and 150 mm², the variation of warpage of the semiconductor package structure may be ideally and optimally controlled to be between 53 μm and 68 μm by selecting a thickness value and a material of the warp-resistant layer.

Tables 2-1 to 2-4 below are statistical tables of the variation of warpage of the semiconductor package structure according to another embodiment of the present disclosure with different thicknesses of warp-resistant layers when the area of the substrate unit 10 is between 150 mm² and 310 mm². TherMoiré PS400 from Akrometrix Inc. is used to measure warpage. Referring to Table 2-1, Table 2-2, and Table 2-3, when the size of the substrate unit 10 of the semiconductor package structure 1 is approximately 169 mm² (for example, for a square substrate of 13 mm*13 mm under a fabrication tolerance of ±0.1 mm, the range of the area is approximately between 166.41 mm² and 171.61 mm²), at a temperature between 25° C. and 260° C., the variation of warpage of the semiconductor package structure having a warp-resistant layer 13 that is made of the material chromium and has a thickness between 0.5 μm and 3 μm may be lowered to between 88 μm and 143 μm, in contrast with a semiconductor package structure without a warp-resistant layer.

TABLE 2-1

| | Variation of warpage | | | | | | |
|---|---|---|---|---|---|---|---|
| | 151 | 172 | 131 | 203 | 111 | 143 | 131 |
| Thickness of warp-resistant layer | 0 μm | 0.5 μm | 1 μm | 1.5 μm | 2 μm | 2.5 μm | 3 μm |
| Material | | | | Cr | | | |
| Thickness of substrate (mm) | | | | 0.21 | | | |
| Number of substrate layers | | | | 2 | | | |
| Thickness of encapsulant (mm) | | | | 0.7 | | | |
| Size (mm²) | | | | 13 × 13 | | | |

TABLE 2-2

| | Variation of warpage | | | | | | |
|---|---|---|---|---|---|---|---|
| | 135 | 130 | 95 | 106 | 114 | 106 | 113 |
| Thickness of warp-resistant layer | 0 μm | 0.5 μm | 1 μm | 1.5 μm | 2 μm | 2.5 μm | 3 μm |
| Material | | | | Cr | | | |
| Thickness of substrate (mm) | | | | 0.26 | | | |
| Number of substrate layers | | | | 2 | | | |
| Thickness of encapsulant (mm) | | | | 0.7 | | | |
| Size (mm²) | | | | 13 × 13 | | | |

TABLE 2-3

| | Variation of warpage | | | | | | |
|---|---|---|---|---|---|---|---|
| | 120 | 113 | 88 | 97 | 103 | 98 | 105 |
| Thickness of warp-resistant layer | 0 μm | 0.5 μm | 1 μm | 1.5 μm | 2 μm | 2.5 μm | 3 μm |
| Material | | | | Cr | | | |
| Thickness of substrate (mm) | | | | 0.26 | | | |
| Number of substrate layers | | | | 4 | | | |
| Thickness of encapsulant (mm) | | | | 0.7 | | | |
| Size (mm²) | | | | 13 × 13 | | | |

TABLE 2-4

| | Variation of warpage | | | | | | |
|---|---|---|---|---|---|---|---|
| | 265 | 235 | 178 | 187 | 178 | 191 | 75 |
| Thickness of warp-resistant layer | 0 μm | 0.5 μm | 1 μm | 1.5 μm | 2 μm | 2.5 μm | 3 μm |
| Material | | | | Cr | | | |

TABLE 2-4-continued

| | Variation of warpage | | | | | | |
|---|---|---|---|---|---|---|---|
| | 265 | 235 | 178 | 187 | 178 | 191 | 75 |
| Thickness of substrate (mm) | | | | 0.26 | | | |
| Number of substrate layers | | | | 4 | | | |
| Thickness of encapsulant (mm) | | | | 0.7 | | | |
| Size (mm²) | | | | 17.5 ×17.5 | | | |

Referring to Table 2-4 again, when the size of the substrate unit 10 of the semiconductor package structure 1 is approximately 306.25 mm² (for example, for a square substrate of 17.5 mm*17.5 mm under a fabrication tolerance of ±0.1 mm, the range of the area is approximately between 302.76 mm² and 309.76 mm²), at a temperature between 25° C. and 260° C., the variation of warpage of the semiconductor package structure having a warp-resistant layer 13 that is made of the material chromium and has a thickness between 0.5 μm and 3 μm may be lowered to between 75 μm and 235 μm, in contrast with a semiconductor package structure without a warp-resistant layer.

Further, as shown in the results in Table 2-1 to Table 2-4, when the area of the substrate is between 150 mm² and 310 mm², the variation of warpage of the semiconductor package structure may be ideally and optimally controlled to be between 75 μm and 111 μm by selecting a thickness value and a material of a warp-resistant layer.

Tables 3-1 to 3-5 below are statistical tables of the variation of warpage of the semiconductor package structure according to yet another embodiment of the present disclosure with different thicknesses of warp-resistant layers when the area of the substrate unit 10 is between 310 mm² and 412.1 mm². TherMoiré PS400 from Akrometrix Inc. is used to measure warpage.

TABLE 3-1

| | Variation of warpage | | | | | | |
|---|---|---|---|---|---|---|---|
| | 245 | 236 | 228 | 227 | 219 | 180 | 223 |
| Thickness of warp-resistant layer | 0 μm | 0.5 μm | 1 μm | 1.5 μm | 2 μm | 2.5 μm | 3 μm |
| Material | | | | Cr | | | |
| Thickness of substrate (mm) | | | | 0.21 | | | |
| Number of substrate layers | | | | 2 | | | |
| Thickness of encapsulant (mm) | | | | 0.7 | | | |
| Size (mm²) | | | | 19 × 19 | | | |

TABLE 3-2

| | Variation of warpage | | | | | | |
|---|---|---|---|---|---|---|---|
| | 303 | 238 | 232 | 227 | 214 | 140 | 113 |
| Thickness of warp-resistant layer | 0 μm | 0.5 μm | 1 μm | 1.5 μm | 2 μm | 2.5 μm | 3 μm |
| Material | | | | Cr | | | |
| Thickness of substrate (mm) | | | | 0.13 | | | |
| Number of substrate layers | | | | 2 | | | |

TABLE 3-2-continued

| | Variation of warpage | | | | | | |
|---|---|---|---|---|---|---|---|
| | 303 | 238 | 232 | 227 | 214 | 140 | 113 |
| Thickness of encapsulant (mm) | 0.7 | | | | | | |
| Size (mm$^2$) | 19 × 19 | | | | | | |

TABLE 3-3

| | Variation of warpage | | | | | | |
|---|---|---|---|---|---|---|---|
| | 318 | 268 | 290 | 269 | 287 | 276 | 209 |
| Thickness of warp-resistant layer | 0 μm | 0.5 μm | 1 μm | 1.5 μm | 2 μm | 2.5 μm | 3 μm |
| Material | Cr | | | | | | |
| Thickness of substrate (mm) | 0.26 | | | | | | |
| Number of substrate layers | 2 | | | | | | |
| Thickness of encapsulant (mm) | 0.7 | | | | | | |
| Size (mm$^2$) | 20.2 ×20.2 | | | | | | |

TABLE 3-4

| | Variation of warpage | | | | | | |
|---|---|---|---|---|---|---|---|
| | 303 | 264 | 208 | 179 | 155 | 158 | 151 |
| Thickness of warp-resistant layer | 0 μm | 0.5 μm | 1 μm | 1.5 μm | 2 μm | 2.5 μm | 3 μm |
| Material | Cr | | | | | | |
| Thickness of substrate (mm) | 0.26 | | | | | | |
| Number of substrate layers | 4 | | | | | | |
| Thickness of encapsulant (mm) | 0.7 | | | | | | |
| Size (mm$^2$) | 20.2 ×20.2 | | | | | | |

TABLE 3-5

| | Variation of warpage | | | | | | |
|---|---|---|---|---|---|---|---|
| | 237 | 223 | 217 | 213 | 192 | 190 | 159 |
| Thickness of warp-resistant layer | 0 μm | 0.5 μm | 1 μm | 1.5 μm | 2 μm | 2.5 μm | 3 μm |
| Material | Cr | | | | | | |
| Thickness of substrate (mm) | 0.36 | | | | | | |
| Number of substrate layers | 4 | | | | | | |
| Thickness of encapsulant (mm) | 0.7 | | | | | | |
| Size (mm$^2$) | 20.2 ×20.2 | | | | | | |

Referring to Table 3-1 and Table 3-2, when the size of the substrate unit 10 of the semiconductor package structure 1 is approximately 361 mm$^2$ (for example, for a square substrate of 19 mm*19 mm under a fabrication tolerance of ±0.1 mm, the range of the area is approximately between 357.21 mm$^2$ and 364.81 mm$^2$), at a temperature between 25° C. and 260° C., the variation of warpage of the semiconductor package structure having a warp-resistant layer 13 that is made of the material chromium and has a thickness between 0.5 μm and 3 μm may be lowered to between 113 μm and 238 μm, in contrast with a semiconductor package structure without a warp-resistant layer.

Referring to Table 3-3, Table 3-4 and Table 3-5, when the size of the substrate unit 10 of the semiconductor package structure 1 is approximately 408.04 mm$^2$ (for example, for a square substrate of 20.2 mm*20.2 mm under a fabrication tolerance of ±0.1 mm, the range of the area is approximately between 404.01 mm$^2$ and 412.09 mm$^2$), at a temperature between 25° C. and 260° C., the variation of warpage of the semiconductor package structure having a warp-resistant layer 13 that is made of the material chromium and has a thickness between 0.5 μm and 3 μm may be lowered to between 151 μm and 290 μm and under ideal conditions, may further be lowered to between 151 μm and 209 μm, in contrast with a semiconductor package structure without a warp-resistant layer.

Further, as shown in the results in Table 3-1 to Table 3-5, when the area of the substrate is between 310 mm$^2$ and 412.1 mm$^2$, the variation of warpage of the semiconductor package structure may be ideally and optimally controlled between 113 μm and 209 μm by selecting a thickness value and a material of a warp-resistant layer.

Tables 4-1 to 4-2 below are statistical tables of the variation of warpage of the semiconductor package structure according to yet another embodiment of the present disclosure with different thicknesses of warp-resistant layers when the area of the substrate unit 10 is between 524.4 mm$^2$ and 967.2 mm$^2$. TherMoiré PS400 from Akrometrix Inc. is used to measure warpage.

TABLE 4-1

| | Variation of warpage | | | | | | |
|---|---|---|---|---|---|---|---|
| | 302 | 268 | 253 | 234 | 237 | 223 | 217 |
| Thickness of warp-resistant layer | 0 μm | 0.5 μm | 1 μm | 1.5 μm | 2 μm | 2.5 μm | 3 μm |
| Material | Cr | | | | | | |
| Thickness of substrate (mm) | 0.56 | | | | | | |
| Number of substrate layers | 2 | | | | | | |
| Thickness of encapsulant (mm) | 1.17 | | | | | | |
| Size (mm$^2$) | 23 × 23 | | | | | | |

TABLE 4-2

| | Variation of warpage | | | | | | |
|---|---|---|---|---|---|---|---|
| | 688 | 630 | 607 | 605 | 560 | 568 | 614 |
| Thickness of warp-resistant layer | 0 μm | 0.5 μm | 1 μm | 1.5 μm | 2 μm | 2.5 μm | 3 μm |
| Material | Cr | | | | | | |
| Thickness of substrate (mm) | 0.26 | | | | | | |
| Number of substrate layers | 4 | | | | | | |
| Thickness of encapsulant (mm) | 0.7 | | | | | | |
| Size (mm$^2$) | 31 × 31 | | | | | | |

Referring to Table 4-1 first, when the size of the substrate unit 10 of the semiconductor package structure 1 is approximately 529 mm$^2$ (for example, for a square substrate of 23 mm*23 mm under a fabrication tolerance of ±0.1 mm, the range of the area is approximately between 524.41 mm² and 533.61 mm²), at a temperature between 25° C. and 260° C., the variation of warpage of the semiconductor package structure having a warp-resistant layer 13 that is made of the material chromium and has a thickness between 0.5 μm and 3 μm may be lowered to between 217 μm and 268 μm, in contrast with a semiconductor package structure without a warp-resistant layer.

Referring to Table 4-2, when the size of the substrate unit 10 of the semiconductor package structure 1 is approximately 961 mm² (for example, for a square substrate of 31 mm*31 mm under a fabrication tolerance of ±0.1 mm, the range of the area is approximately between 954.81 mm² and 967.21 mm²), at a temperature between 25° C. and 260° C., the variation of warpage of the semiconductor package structure having a warp-resistant layer 13 that is made of the material chromium and has a thickness between 0.5 μm and 3 μm may be lowered to between 560 μm and 630 μm, in contrast with a semiconductor package structure without a warp-resistant layer.

Further, as shown in the results in Table 4-1 and Table 4-2, when the area of the substrate is between 524 mm² and 967 mm², the variation of warpage of the semiconductor package structure may be ideally and optimally controlled between 217 μm and 560 μm by selecting a thickness value and a material of a warp-resistant layer.

Tables 5 to 9 below are statistical tables of the variation of warpage of the semiconductor package structure according to another embodiment(s) of the present disclosure with different thicknesses of warp-resistant layers when the area of the substrate unit 10 is between 8 mm² and 90 mm² (same means as above-mentioned is also used to measure the warpage and, as mentioned above, the size of the substrate unit slightly varies due to the fabrication tolerance of 0.1 mm). Tables 5 to 9 also show the effects achieved by the present invention, the variation of warpage of the semiconductor package structure may be ideally and optimally controlled between 3 μm and 38 μm by selecting a thickness value and a material of a warp-resistant layer.

TABLE 5

| | Variation of warpage | | | | | | |
|---|---|---|---|---|---|---|---|
| | 6 | 7 | 4 | 4 | 3 | 5 | 4 |
| Thickness of warp-resistant layer | 0 μm | 0.5 μm | 1 μm | 1.5 μm | 2 μm | 2.5 μm | 3 μm |
| Material | | | | Cr | | | |
| Thickness of substrate (mm) | | | | 0.21 | | | |
| Number of substrate layers | | | | 2 | | | |
| Thickness of encapsulant (mm) | | | | 0.7 | | | |
| Size (mm²) | | | | 3 × 3 | | | |

TABLE 6

| | Variation of warpage | | | | | | |
|---|---|---|---|---|---|---|---|
| | 37 | 35 | 32 | 38 | 35 | 31 | 31 |
| Thickness of warp-resistant layer | 0 μm | 0.5 μm | 1 μm | 1.5 μm | 2 μm | 2.5 μm | 3 μm |
| Material | | | | Cr | | | |
| Thickness of substrate (mm) | | | | 0.105 | | | |

TABLE 6-continued

| | Variation of warpage | | | | | | |
|---|---|---|---|---|---|---|---|
| | 37 | 35 | 32 | 38 | 35 | 31 | 31 |
| Number of substrate layers | | | | 2 | | | |
| Thickness of encapsulant (mm) | | | | 0.25 | | | |
| Size (mm²) | | | | 6 × 6 | | | |

TABLE 7

| | Variation of warpage | | | | | | |
|---|---|---|---|---|---|---|---|
| | 35 | 29 | 28 | 26 | 12 | 12 | 13 |
| Thickness of warp-resistant layer | 0 μm | 0.5 μm | 1 μm | 1.5 μm | 2 μm | 2.5 μm | 3 μm |
| Material | | | | Cr | | | |
| Thickness of substrate (mm) | | | | 0.26 | | | |
| Number of substrate layers | | | | 2 | | | |
| Thickness of encapsulant (mm) | | | | 0.54 | | | |
| Size (mm²) | | | | 7 × 7 | | | |

TABLE 8

| | Variation of warpage | | | | | | |
|---|---|---|---|---|---|---|---|
| | 44 | 42 | 39 | 38 | 39 | 40 | 40 |
| Thickness of warp-resistant layer | 0 μm | 0.5 μm | 1 μm | 1.5 μm | 2 μm | 2.5 μm | 3 μm |
| Material | | | | Cr | | | |
| Thickness of substrate (mm) | | | | 0.21 | | | |
| Number of substrate layers | | | | 2 | | | |
| Thickness of encapsulant (mm) | | | | 0.8 | | | |
| Size (mm²) | | | | 8 × 8 | | | |

TABLE 9

| | Variation of warpage | | | | | | |
|---|---|---|---|---|---|---|---|
| | 72 | 49 | 43 | 39 | 29 | 23 | 18 |
| Thickness of warp-resistant layer | 0 μm | 0.5 μm | 1 μm | 1.5 μm | 2 μm | 2.5 μm | 3 μm |
| Material | | | | Cr | | | |
| Thickness of substrate (mm) | | | | 0.21 | | | |
| Number of substrate layers | | | | 2 | | | |
| Thickness of encapsulant (mm) | | | | 0.54 | | | |
| Size (mm²) | | | | 9 × 9 | | | |

Therefore, by combining Table 1-1 to Table 9, the variations of warpage of the semiconductor package structures are ideally and optimally all lower than 560 μm.

To sum up, in the semiconductor package structure of the present disclosure, by disposing, on a top surface of a packaging encapsulant, a warp-resistant layer with a selected thickness formed of a selected material, the variation of warpage of the semiconductor package structure can actually be lowered; that is, the warpage change of the semiconductor package structure in an environment where the temperature changes from the room temperature to a high temperature is also lowered, thereby mitigating a yield problem caused by an excessively large variation in warpage. For example, the problem of poor internal wire bonding due to an excessively large variation of warpage is mitigated.

Figure 5A:
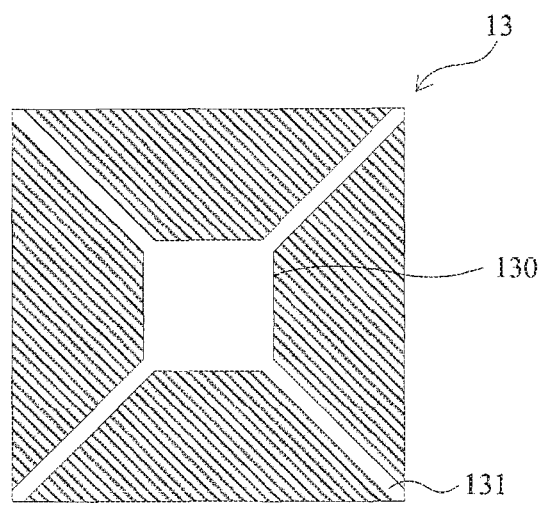
FIG. 5A is a schematic top view of a semiconductor package structure according to an embodiment of the present disclosure.
Figure 5B:
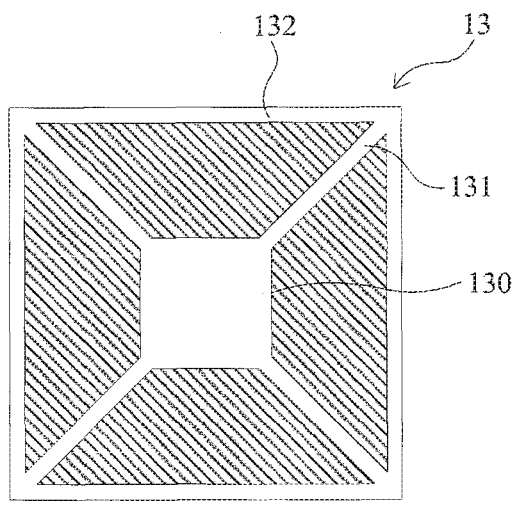
FIG. 5B is a schematic top view of a semiconductor package structure according to another embodiment of the present disclosure.

In addition, further referring to FIG. 5A, which is a schematic top view of a semiconductor package structure according to an embodiment of the present disclosure. A thickening portion 130 may be further formed on the top surface of the warp-resistant layer 13 of the semiconductor package structure 1 according to the present disclosure so as to locally strengthen warp-resisting capability at locations where warpage occurs easily (or in directions in which warpage occurs easily) in the semiconductor package structure. The thickening portion 130 may comprise a plurality of radially extending ribs 131. Further as shown in FIG. 5B, the thickening portion 130 may further comprise frame portions 132 that are formed along the edges of the warp-resistant layer 13.

The present disclosure has been described with the foregoing embodiments. However, the foregoing embodiments are only examples for exploiting the present disclosure. It should be noted that the disclosed embodiments do not limit the scope of the present disclosure. On the contrary, modifications and equivalent arrangements that fall within the spirit and scope of the claims shall all fall within the scope of the present disclosure.

What is claimed is:

1. A fabrication method of a semiconductor package structure, the fabrication method comprising:
providing a substrate strip, the substrate strip comprising a plurality of substrate units which comprise a substrate unit;
disposing a plurality of chips on the plurality of substrate units;
disposing a packaging encapsulant on the substrate strip to encapsulate the chips;
forming a warp-resistant layer on a top surface of the packaging encapsulant; and
dividing the substrate strip to separate the plurality of substrate units to further fabricate a plurality of semiconductor package structures which comprise a semiconductor package structure comprising the substrate unit, wherein the warp-resistant layer is formed of a selected material with a selected thickness to make a variation of warpage of the semiconductor package structure at a temperature between 25° C. and 260° C. to be smaller than 560 μm.

2. The fabrication method of the semiconductor package structure according to claim 1, wherein the warp-resistant layer and the substrate units are insulated from each other.

3. The fabrication method of the semiconductor package structure according to claim 1, wherein the selected material is chromium and the selected thickness is between 0.5 μm and 3 μm.

4. The fabrication method of the semiconductor package structure according to claim 1, wherein an area of the substrate unit is between 8 mm$^2$ and 90 mm$^2$, and the variation of warpage of the semiconductor package structure is between 3 μm and 38 μm.

5. The fabrication method of the semiconductor package structure according to claim 1, wherein an area of the substrate unit is between 98 mm$^2$ and 150 mm$^2$, and the variation of warpage of the semiconductor package structure is between 53 μm and 68 μm.

6. The fabrication method of the semiconductor package structure according to claim 1, wherein an area of the substrate unit is between 150 mm$^2$ and 310 mm$^2$, and the variation of warpage of the semiconductor package structure is between 75 μm and 111 μm.

7. The fabrication method of the semiconductor package structure according to claim 1, wherein an area of the substrate unit is between 310 mm$^2$ and 412.1 mm$^2$, and the variation of warpage of the semiconductor package structure is between 113 μm and 209 μm.

8. The fabrication method of the semiconductor package structure according to claim 1, wherein an area of the substrate unit is between 524 mm$^2$ and 967 mm$^2$, and the variation of warpage of the semiconductor package structure is between 217 μm and 560 μm.

9. The fabrication method of the semiconductor package structure according to claim 1, wherein an area of the substrate unit is between 98.01 mm$^2$ and 102.01 mm$^2$, and the variation of warpage of the semiconductor package structure is between 53 μm and 60 μm.

10. The fabrication method of the semiconductor package structure according to claim 1, wherein an area of the substrate unit is between 141.61 mm$^2$ and 146.41 mm$^2$, and the variation of warpage of the semiconductor package structure is between 64 μm and 99 μm.

11. The fabrication method of the semiconductor package structure according to claim 1, wherein an area of the substrate unit is between 166.41 mm$^2$ and 171.61 mm$^2$, and the variation of warpage of the semiconductor package structure is between 88 μm and 143 μm.

12. The fabrication method of the semiconductor package structure according to claim 1, wherein an area of the substrate unit is between 302.76 mm$^2$ and 309.76 mm$^2$, and the variation of warpage of the semiconductor package structure is between 75 μm and 235 μm.

13. The fabrication method of the semiconductor package structure according to claim 1, wherein an area of the substrate unit is between 357.21 mm$^2$ and 364.81 mm$^2$, and the variation of warpage of the semiconductor package structure is between 113 μm and 238 μm.

14. The fabrication method of the semiconductor package structure according to claim 1, wherein an area of the substrate unit is between 404.01 mm$^2$ and 412.09 mm$^2$, and the variation of warpage of the semiconductor package structure is between 151 μm and 290 μm.

15. The fabrication method of the semiconductor package structure according to claim 1, wherein an area of the substrate unit is between 524.41 mm$^2$ and 533.61 mm$^2$, and the variation of warpage of the semiconductor package structure is between 217 μm and 268 μm.

16. A fabrication method of a semiconductor package structure, the fabrication method comprising:
providing a substrate strip, the substrate strip comprising a plurality of substrate units;
disposing a plurality of chips on the plurality of substrate units;
disposing a packaging encapsulant on the substrate strip to encapsulate the chips;
forming a warp-resistant layer on a top surface of the packaging encapsulant; and
dividing the substrate strip to separate the plurality of substrate units to further fabricate a plurality of semiconductor package structures, wherein an area of at least one substrate unit is between 954.81 mm$^2$ and 967.21 mm$^2$, and wherein the warp-resistant layer is formed of a selected material with a selected thickness to make a variation of warpage of at least one semiconductor package structure between 560 μm and 630 μm.

17. A semiconductor package structure, comprising:
a substrate unit;
a chip, disposed on the substrate unit;
a packaging encapsulant, disposed on the substrate unit and covering the chip; and
a warp-resistant layer, formed on a top surface of the packaging encapsulant, wherein the warp-resistant layer is formed of a selected material with a selected thickness to make a variation of warpage of the semiconductor package structure at a temperature between 25° C. and 260° C. to be smaller than 560 μm.

18. The semiconductor package structure according to claim 17, wherein the warp-resistant layer and the substrate unit are insulated from each other.

19. The semiconductor package structure according to claim 17, wherein a thickening portion is further formed on a top surface of the warp-resistant layer and the thickening portion comprises a plurality of ribs.

20. The semiconductor package structure according to claim 17, wherein the selected material is chromium and the selected thickness is between 0.5 μm and 3 μm.

21. The semiconductor package structure according to claim 17, wherein an area of the substrate unit is between 8 mm$^2$ and 98 mm$^2$, and the variation of warpage of the semiconductor package structure is between 3 μm and 38 μm.

22. The semiconductor package structure according to claim 17, wherein an area of the substrate unit is between 98 mm$^2$ and 150 mm$^2$, and the variation of warpage of the semiconductor package structure is between 53 μm and 68 μm.

23. The semiconductor package structure according to claim 17, wherein an area of the substrate unit is between 150 mm$^2$ and 310 mm$^2$, and the variation of warpage of the semiconductor package structure is between 75 μm and 111 μm.

24. The semiconductor package structure according to claim 17, wherein an area of the substrate unit is between 310 mm$^2$ and 412.1 mm$^2$, and the variation of warpage of the semiconductor package structure is between 113 μm and 209 μm.

25. The semiconductor package structure according to claim 17, wherein an area of the substrate unit is between 524 mm$^2$ and 967 mm$^2$, and the variation of warpage of the semiconductor package structure is between 217 μm and 560 μm.

* * * * *